United States Patent
Uno et al.

(10) Patent No.: US 8,527,914 B2
(45) Date of Patent: Sep. 3, 2013

(54) FLARE MAP CALCULATING METHOD AND RECORDING MEDIUM

(75) Inventors: Taiga Uno, Kanagawa (JP); Toshiya Kotani, Tokyo (JP); Satoshi Tanaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/615,691

(22) Filed: Sep. 14, 2012

(65) Prior Publication Data

US 2013/0159944 A1      Jun. 20, 2013

(30) Foreign Application Priority Data

Dec. 15, 2011  (JP) ................................. 2011-274899

(51) Int. Cl.
  *G06F 17/50*  (2006.01)
(52) U.S. Cl.
  USPC ............................................. 716/52; 716/53
(58) Field of Classification Search
  USPC ...................................................... 716/50–54
  See application file for complete search history.

(56) References Cited

U.S. PATENT DOCUMENTS

| 6,625,802 | B2 |  | 9/2003 | Singh et al. |
| 6,898,781 | B2 |  | 5/2005 | Singh et al. |
| 7,234,130 | B2 |  | 6/2007 | Word et al. |
| 7,240,307 | B2 | * | 7/2007 | Aoyama et al. ................. 716/53 |
| 8,039,177 | B2 |  | 10/2011 | Uno et al. |
| 8,227,151 | B2 |  | 7/2012 | Inanami et al. |
| 2005/0257187 | A1 | * | 11/2005 | Gallatin et al. ................. 716/21 |
| 2010/0258744 | A1 |  | 10/2010 | Kim et al. |

FOREIGN PATENT DOCUMENTS

| JP | 3954216 | 5/2007 |
| JP | 2007-524255 | 8/2007 |
| JP | 2011-2722 | 1/2011 |
| JP | 2011-23549 | 2/2011 |
| JP | 2011-66079 | 3/2011 |

* cited by examiner

*Primary Examiner* — Binh Tat
(74) *Attorney, Agent, or Firm* — Finnegan, Henderson, Farabow, Garrett & Dunner, L.L.P.

(57) ABSTRACT

A flare map calculating method of an embodiment calculates an optical image intensity distribution in each division region set in a pattern region. Furthermore, an average value of the optical image intensity distribution is calculated in each division region. A pattern or plural patterns, which has a pattern density corresponding to the average value, is calculated as a corresponding density pattern in each division region. Furthermore, a density map, which represents a pattern density distribution within the pattern region, is generated based on the corresponding density pattern, and a flare map representing a flare intensity distribution within the pattern region is calculated by convolution integral of the density map and a point spread function.

20 Claims, 9 Drawing Sheets

FIG.7A
DENSITY PATTERN GROUP

FIG.7B
DENSITY MAP

FIG.7C
FLARE MAP

FLARE MAP CALCULATING METHOD AND RECORDING MEDIUM

CROSS-REFERENCE TO RELATED APPLICATIONS

This application is based upon and claims the benefit of priority from Japanese Patent Application No. 2011-274899, filed on Dec. 15, 2011; the entire contents of which are incorporated herein by reference.

FIELD

Embodiments described herein relate generally to a flare map calculating method and a recording medium.

BACKGROUND

In an exposure apparatus used for manufacturing a semiconductor device (semiconductor integrated circuit), due to the miniaturization of patterns, Extreme Ultra Violet (EUV) having a shorter wavelength than ArF has been used. Due to the shortened wavelength of exposure light, the resolution of exposure transcription pattern is increased, and fine pattern formation is enabled. Meanwhile, due to the shortened wavelength, an apparatus configuration or an exposure method is changing from a conventional exposure method. As a greatly changing point, there may be a projection optical system. In a conventional projection optical system, a refractive lens is used. However, in EUV exposure, EUV light does not pass through the refractive lens due to a relation between a light absorption and a refractive index. For this reason, in an EUV exposure apparatus, a conventional refractive lens cannot be used, and a catoptric system such as a mirror is used.

In manufacturing a mirror, a mirror surface cannot be finished to be completely flat. Thus, roughness is formed on the mirror surface. When the roughness is formed, exposure light irradiated on the mirror surface is diffusely reflected during pattern exposure, and an unintended region on a resist surface of a wafer is exposed to scattered light. Therefore, a contrast on a wafer is lowered, a pattern image is blurred. As a result, there occurs a problem that a finished dimension (finished pattern shape) is not formed as desired.

The exposure light diffusely reflected on the mirror surface is referred to as flare, which is considered as one of main factors that degrade the pattern formation accuracy in the EUV exposure. Also, since an amount of flare is the cause of exposure of scattered light from surroundings, an amount of flare is varied by a surrounding pattern density. Therefore, even in the same mask pattern, there occurs a problem that a finished dimension is different by a place (pattern arrangement position). For this reason, there is a need for technology that calculates a flare map at high speed and with high accuracy.

DETAILED DESCRIPTION

According to an embodiment, a flare map calculating method is provided. In the flare map calculating method, by dividing a pattern region having a plurality of patterns, a plurality of division regions are set in the pattern region. By performing an exposure simulation in each division region, an optical image intensity (aerial image intensity) distribution in each division region is calculated. Furthermore, the average value of the optical image intensity distribution within the division region is calculated as an average value of an optical intensity distribution in each division region. A pattern or plural patterns, which has a pattern density corresponding to the average value of the optical intensity distribution, is generated as a corresponding density pattern in each division region. Then, a density map, which represents a pattern density distribution within the pattern region, is generated based on the corresponding density pattern, and a flare map representing a flare intensity distribution within the pattern region is calculated by convolution integral of the density map and a point spread function.

Hereinafter, a flare map calculating method and a recording medium according to embodiments will be described in detail with reference to the accompanying drawings. Also, the present invention is not limited to the embodiments.

Embodiment

Figure 1:
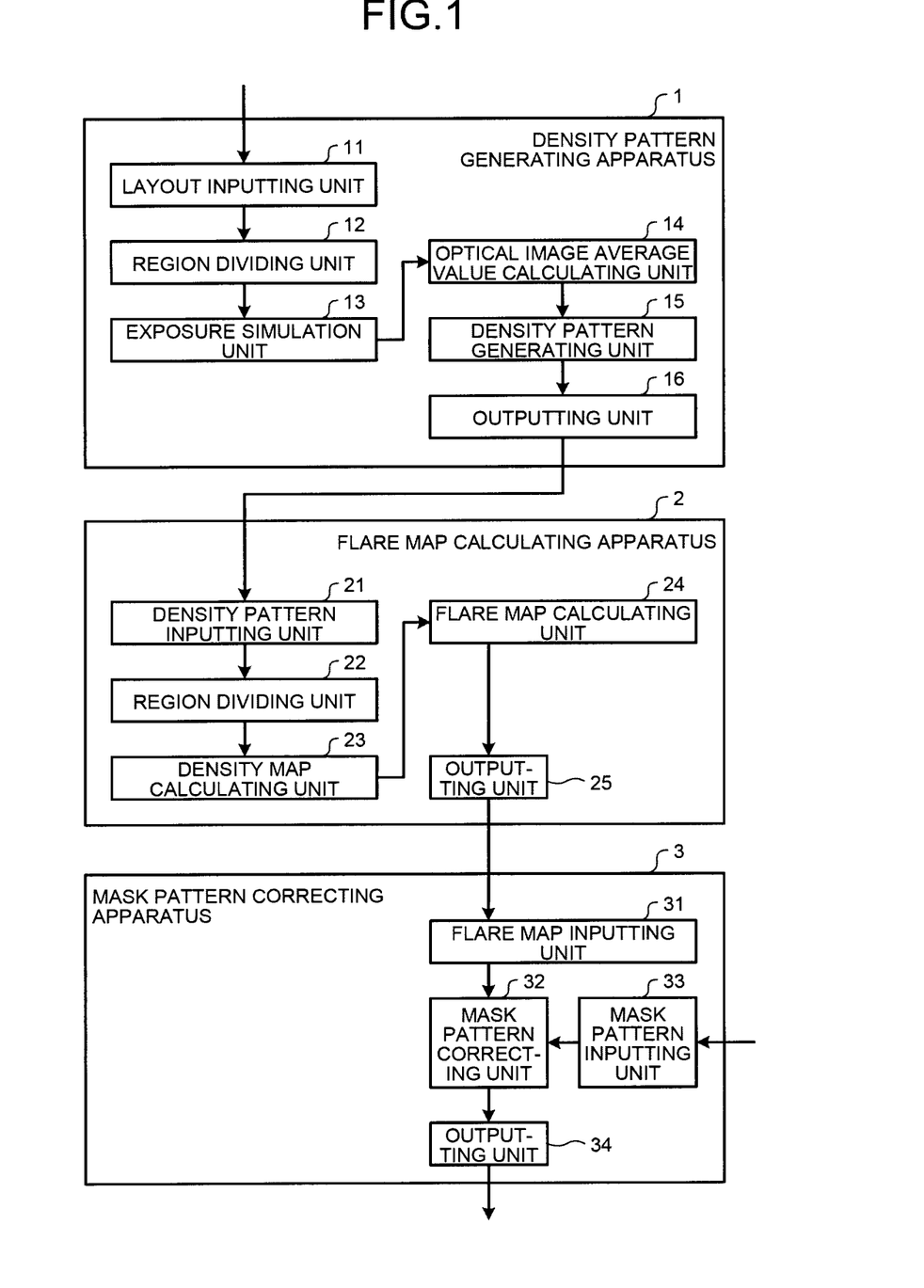
FIG. 1 is a block diagram illustrating a configuration of a mask pattern correcting system according to an embodiment.

FIG. 1 is a block diagram illustrating a configuration of a mask pattern correcting system according to an embodiment. The mask pattern correcting system includes a density pattern generating apparatus 1, a flare map calculating apparatus 2, and a mask pattern correcting apparatus 3.

The mask pattern correcting system is a system that creates a mask pattern used for forming a semiconductor device (semiconductor integrated circuit) by flare-correcting a mask pattern. In the mask pattern correcting system, the density pattern generating apparatus 1 generates a density pattern (pattern having a pattern density according to an optical image intensity) used for generating a flare map. Also, the flare map calculating apparatus 2 generates a flare map by using the density pattern, and the mask pattern correcting apparatus 3 corrects the mask pattern by using the flare map.

The density pattern generating apparatus 1 is a computer or the like that generates the density pattern by using layout data (design layout pattern). The flare map calculating apparatus 2 is a computer or the like that calculates the flare map by using the density pattern. The mask pattern correcting apparatus 3 is a computer or the like that corrects the mask pattern by using the flare map.

The density pattern generating apparatus 1 of the embodiment performs an exposure simulation (optical image simulation) in each region partitioned with a predetermined width. The density pattern generating apparatus 1 calculates an average value of an optical image intensity (average value of optical intensity distribution to be described later) (average value of optical image) in each region (partition), and generates a density pattern (distribution of average value of optical intensity distribution) according to the average value of the optical intensity distribution in each region.

Also, the flare map calculating apparatus 2 of the embodiment performs a flare calculation using the optical image intensity by convolution calculation of the density pattern and a point spread function (PSF).

The density pattern generating apparatus 1 includes a layout inputting unit 11, a region dividing unit 12, an exposure simulation unit 13, an optical image average value calculating unit 14, a density pattern generating unit 15, and an outputting unit 16.

The layout inputting unit 11 receives layout data of a pattern subjected to flare correction from an external device or the like, and transfers the layout data to the region dividing unit 12. The region dividing unit 12 divides the layout data into a plurality of regions by partitioning (meshing) the layout data in a tile shape with a predetermined width (first width) (for example, 1 μm in height and width). In other words, the region dividing unit 12 sets a plurality of division regions in a layout pattern region by dividing a layout pattern region having a plurality of patterns in a mesh shape. The region dividing unit 12 transfers information (division result) indicating respective ranges of the divided regions (hereinafter, referred to as layout division regions 61A), and layout data within the respective layout division regions 61A, to the exposure simulation unit 13.

The exposure simulation unit 13 performs the exposure simulation by using the layout data within the respective layout division regions 61A in the respective layout division regions 61A divided by the region dividing unit 12. The exposure simulation unit 13 performs the exposure simulation to calculate the optical image intensities of the respective layout division regions 61A.

The exposure simulation is processing (transcription simulation) that calculates the optical image intensity distribution appearing on a wafer when the exposure processing is performed with respect to the wafer (substrate) by using the layout data. In other words, the exposure simulation is processing that calculates the optical image intensity distributions (transcription intensity distributions) corresponding to transcription patterns formed on the wafer when the layout data is transcribed on the wafer. The exposure simulation unit 13 transfers the calculated optical image intensity distributions of the respective layout division regions 61A to the optical image average value calculating unit 14.

The optical image average value calculating unit 14 calculates the average value of the optical image intensities (average transcription amount) (hereinafter, referred to as the average value of the optical intensity distribution) in the respective layout division regions 61A by using the optical image intensity distributions of the respective layout division regions 61A. The optical image average value calculating unit 14 transfers the average value of the optical intensity distributions of the respective layout division regions 61A to the density pattern generating unit 15.

The density pattern generating unit 15 generates the density pattern corresponding to the average value of the optical intensity distribution in each layout division region 61A. The density pattern is a pattern having a pattern density corresponding to the average value of the optical intensity distribution. The density pattern, for example, is generated as a single rectangular pattern. Also, the shape or number of the density patterns is arbitrary, and a certain number of density patterns having a certain shape may be generated. The density pattern generating unit 15 generates a density pattern group (density pattern map) according to the layout pattern by connecting the respective layout division regions 61A where the density patterns are formed. The outputting unit 16 transfers the density pattern group generated by the density pattern generating unit 15 to the flare map calculating apparatus 2.

The flare map calculating apparatus 2 includes a density pattern inputting unit 21, a region dividing unit 22, a density map calculating unit 23, a flare map calculating unit 24, and an outputting unit 25. The density pattern inputting unit 21 receives the density pattern group transferred from the density pattern generating apparatus 1, and transfers the density pattern group to the region dividing unit 22.

The region dividing unit 22 divides the density pattern group into a plurality of regions by partitioning the density pattern group by a predetermined width (second width). The region dividing unit 22 transfers information (division result) indicating respective ranges of the divided regions (hereinafter, referred to as density pattern group division regions 61B), and density patterns within the respective density pattern group division regions 61B, to the density map calculating unit 23.

The density map calculating unit 23 calculates densities in the respective density pattern group division regions 61B divided by the region dividing unit 22. The density map is information indicating the pattern densities in the respective density pattern group division regions 61B. In other words, the density map is information indicating the pattern density distribution in the layout pattern region. The density map calculating unit 23 transfers the calculated density map to the flare map calculating unit 24.

The flare map calculating unit 24 calculates the flare map by using the density map calculated by the density map calculating unit 23. The flare map is information indicating a flare value distribution (a flare intensity distribution) in the layout pattern region. The flare map calculating unit 24 calculates the flare map within the layout pattern region by the convolution integral of the density map and the PSF. The flare map calculating unit 24 transfers the calculated flare map to the outputting unit 25. The outputting unit 25 transfers the flare map to the mask pattern correcting apparatus 3.

The mask pattern correcting apparatus 3 includes a flare map inputting unit 31, a mask pattern correcting unit 32, a mask pattern inputting unit 33, and an outputting unit 34. The flare map inputting unit 31 receives the flare map transferred from the flare map calculating apparatus 2, and transfers the flare map to the mask pattern correcting unit 32.

The mask pattern inputting unit 33 receives mask pattern data subjected to flare correction from an external device or the like, and transfers the mask pattern data to the mask pattern correcting unit 32. The mask pattern subjected to the flare correction is a mask pattern corresponding to the layout data that is input to the layout inputting unit 11. In other words, the mask pattern data is pattern data created by using the layout data.

The mask pattern correcting unit 32 performs the flare correction with respect to the mask pattern data, which is transferred from the mask pattern inputting unit 33, by using the flare map. The mask pattern correcting unit 32 transfers the flare-corrected mask pattern data to the outputting unit 34. The outputting unit 34 transfers the flare-corrected mask pattern data to an external device or the like.

Also, the shape of the layout division region 61A dividing the layout data may be square or rectangular. Also, the shape of the density pattern group division region 61B dividing the density pattern group may be square or rectangular.

Also, the width (first width) of the layout division region 61A dividing the layout data may be equal to or different from the width (second width) of the density pattern group division region 61B dividing the density pattern group. In other words, the layout division region 61A and the density pattern group division region 61B may be the same region or different regions. Mesh sizes of the layout division region 61A and the density pattern group division region 61B are determined according to a desired calculation accuracy and a desired calculation speed. For example, by setting the layout division region 61A to a small region, the average value of the optical intensity distribution may be accurately calculated. By setting the layout division region 61A to a large region, the average value of the optical intensity distribution may be calculated in a short time. Also, by setting the density pattern group division region 61B to a small region, the flare map may be accurately calculated. By setting the density pattern group division region 61B to a large region, the flare map may be calculated in a short time.

The mask pattern correcting system, for example, sets the density pattern group division region 61B to a larger region than the layout division region 61A. In this way, while accurately calculating the average value of the optical intensity distribution, the flare map may be calculated in a short time.

Also, the density pattern generating apparatus 1 may generate the density pattern group by using the mask pattern data instead of the layout data. Also, the mask pattern correcting apparatus 3 may perform the flare correction with respect to the mask pattern data prior to optical proximity correction (OPC), and may perform the flare correction with respect to the mask pattern data after OPC.

Figure 2:
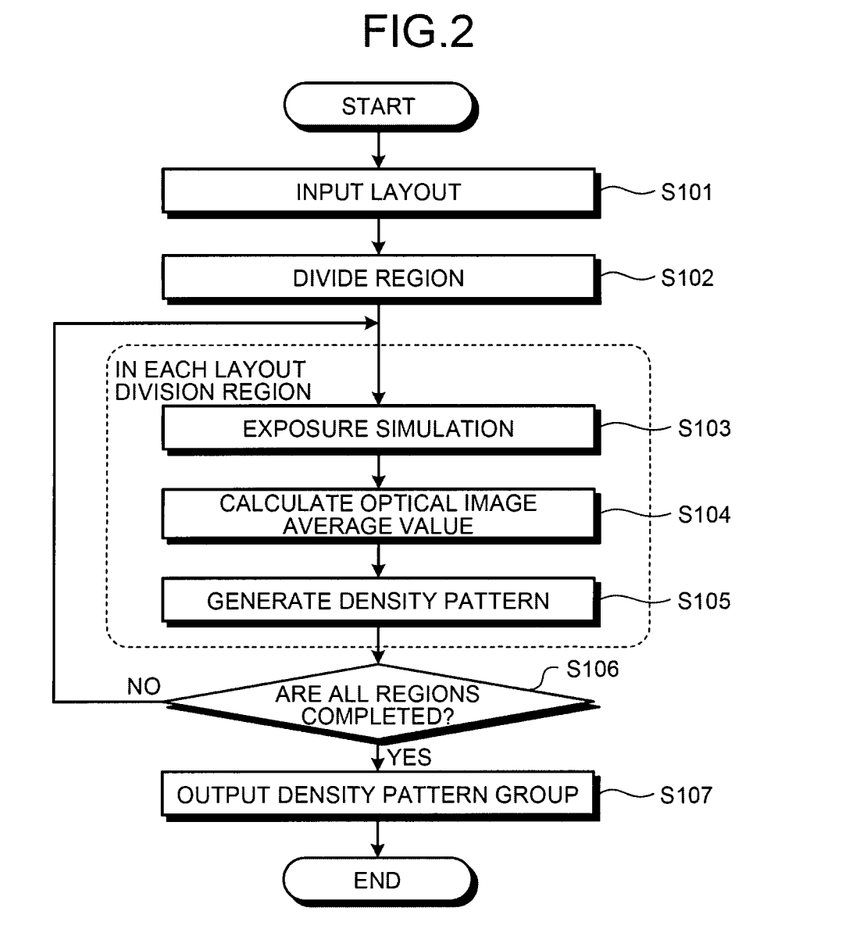
FIG. 2 is a flowchart illustrating a processing procedure of generating a density pattern.

Next, the processing procedure of generating the density pattern will be described. FIG. 2 is a flowchart illustrating the processing procedure of generating the density pattern. The layout inputting unit 11 of the density pattern generating apparatus 1 receives layout data, which includes a pattern subjected to flare calculation, from an external device or the like (step S101), and transfers the layout data to the region dividing unit 12.

The region dividing unit 12 divides the layout data into a plurality of layout division regions 61A (step S102). The region dividing unit 12 transfers information indicating respective ranges of the layout division regions 61A, and layout data within the respective layout division regions 61A, to the exposure simulation unit 13.

The exposure simulation unit 13 performs the exposure simulation by using the layout data within the respective layout division regions 61A in the respective layout division regions 61A divided by the region dividing unit 12. In this way, the exposure simulation unit 13 calculates the optical image intensities of the respective layout division regions 61A.

Specifically, the exposure simulation unit 13 calculates the optical image intensity within the first layout division region 61A by performing the exposure simulation by using the layout data within the first layout division region 61A (step S103).

Figure 3A:
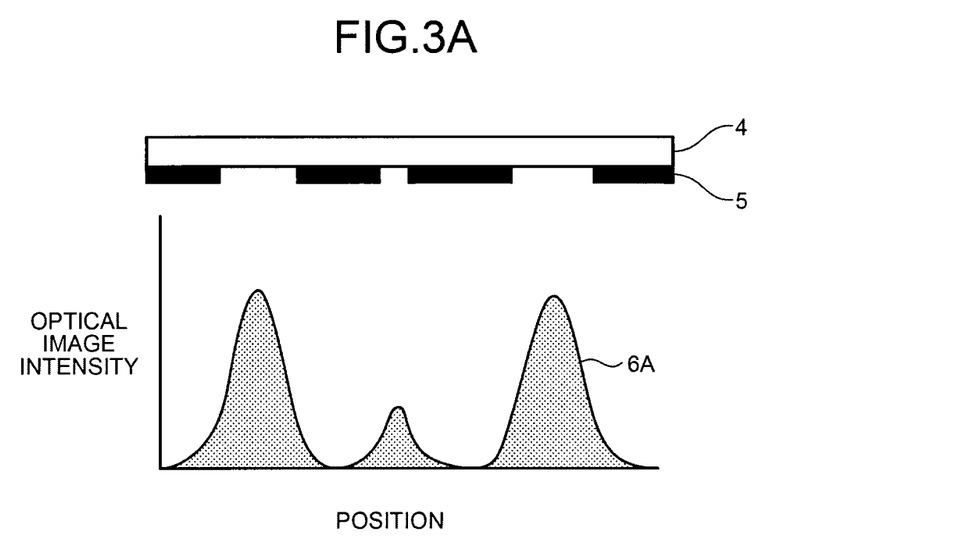
FIGS. 3A and 3B are diagrams describing an optical image intensity within a layout division region.
Figure 3B:
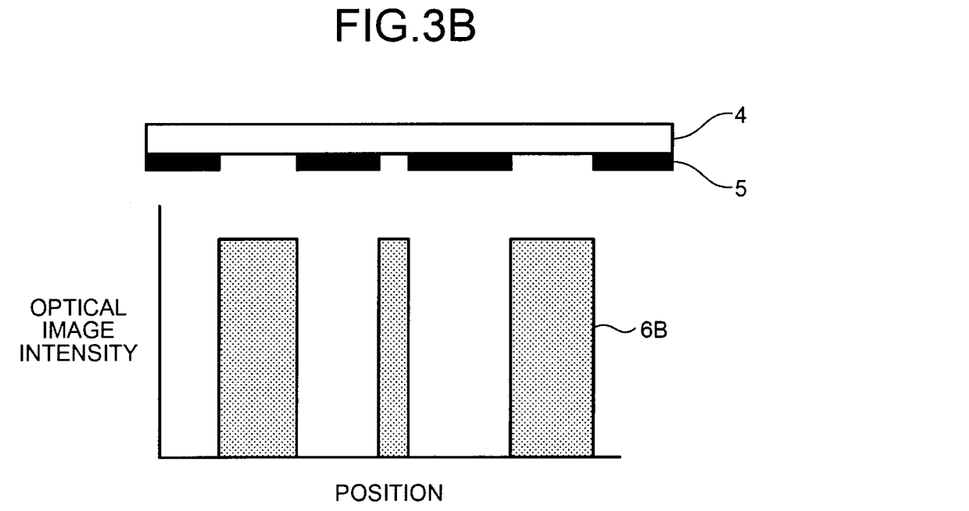

Herein, the optical image intensity within the layout division region 61A will be described. FIGS. 3A and 3B are diagrams describing the optical image intensity within the layout division region. Also, herein, the optical image intensity will be described using the mask pattern instead of the layout pattern. FIG. 3A illustrates the optical image intensity distribution 6A calculated by applying the exposure simulation to the mask pattern. Also, FIG. 3B illustrates the ideal optical image intensity distribution 6B in which a value of a pattern opening of the mask pattern is intensity 1 and a value of a non-opening is intensity 0.

In a mask substrate 4, a light shielding portion 5 is formed as the mask pattern. Therefore, in the mask pattern 4, a section where the light shielding portion 5 is formed becomes a pattern opening, and a section where the light shielding portion 5 is not formed becomes a pattern non-opening.

When the optical image intensity distribution 6B is calculated with respect to the pattern opening/non-opening of the mask pattern, the optical image intensity has a distribution such as a binary pulse signal with respect to the pattern opening/non-opening. Specifically, the optical image intensity in the pattern opening becomes a predetermined value, and the optical image intensity in the pattern non-opening becomes 0. On the other hand, when the optical image intensity distribution 6A is calculated by applying the exposure simulation to the mask pattern, the optical image intensity exhibits a gently curved profile.

Also, since a mask pattern smaller than a wavelength is exposed, exposure amount on the wafer becomes different between large patterns (patterns of end portions located on the left and right of the position) and small patterns (patterns located in the center of the position). For this reason, there occurs a gap between a flare value calculated with respect to the pattern opening/non-opening and a flare value calculated by applying the exposure simulation to the mask pattern.

Figure 4:
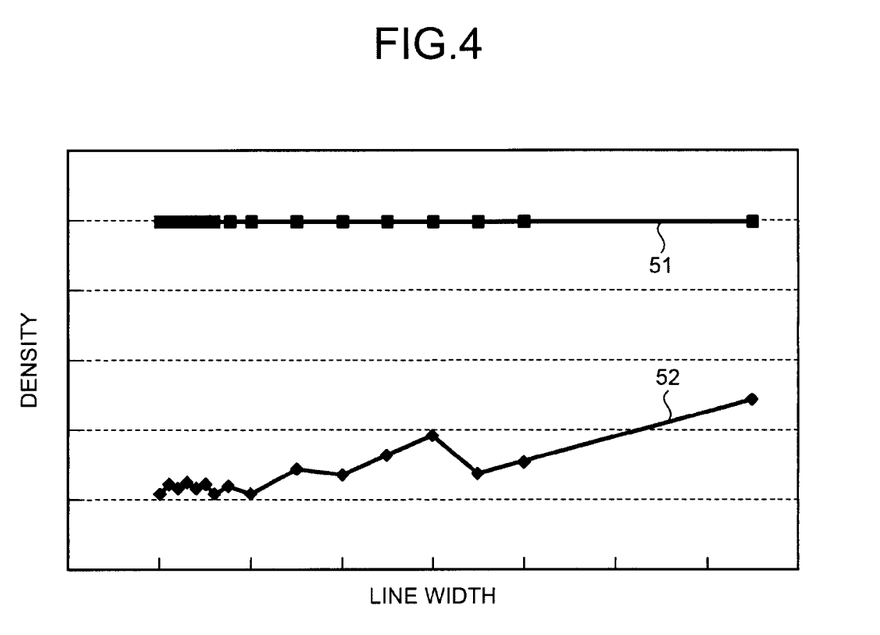
FIG. 4 is a diagram describing a relation between a pattern density and an optical image density.

Herein, a relation between the pattern density of the layout pattern and the optical image density (aerial density) will be described. FIG. 4 is a diagram describing the relation between the pattern density and the optical image density. In a graph illustrated in FIG. 4, a horizontal axis represents a line width of the layout pattern, and a vertical axis represents a density. FIG. 4 illustrates a relation between a line width (line width of a line pattern) derived with respect to a line & space pattern whose ratio of a line width to a space width is 1:1 and a density (pattern density, optical image density).

As represented in a pattern density characteristic 51, a value of the pattern density is substantially constant, regardless of the line width of the line pattern. On the other hand, as shown in an optical image density characteristic 52, a value of the optical image density is varied according to the line width of the line pattern. In this way, the conventional method performs the flare calculation by using the pattern density, but has a problem that the flare value is not accurately calculated. Therefore, in the embodiment, the optical image intensity distribution is calculated by applying the exposure simulation to the mask pattern. In this way, the accurate optical image intensity distribution 6A may be calculated. The exposure simulation unit 13 transfers the optical image intensity distribution of the first layout division region 61A to the optical image average value calculating unit 14 as a first optical image intensity distribution.

The optical image average value calculating unit 14 calculates a first average value of the optical intensity distribution with respect to the first optical image intensity distribution (step S104). The optical image average value calculating unit 14 transfers the first average value of the optical intensity distribution to the density pattern generating unit 15. The density pattern generating unit 15 generates a first density pattern corresponding to the first average value of the optical intensity distribution (step S105).

The value of the optical image intensity generally ranges from 0 to 1. However, in some cases, the value of the optical image intensity may exceed the range. Therefore, in generating the density pattern, it is preferable that the value of the optical image intensity is standardized, and, for example, the value of the optical image intensity is converted to the range of 0 to 1.

The exposure simulation unit 13 determines whether the exposure simulation is performed with respect to all the layout division regions 61A (all regions are completed) (step S106). When the exposure simulation is not completed with respect to all the layout division regions 61A (No in step S106), the exposure simulation unit 13 performs the exposure simulation with respect to the next layout division region 61A. That is, as in the case of the first layout division region 61A, the exposure simulation unit 13 performs the exposure simulation with respect to the Nth (N is a natural number equal to or greater than 2) layout division region 61A by using the layout data within the Nth layout division region 61A (step S103). In this way, the Nth optical image intensity distribution is calculated.

Then, the optical image average value calculating unit 14 calculates an Nth average value of the optical intensity distribution with respect to the Nth optical image intensity distribution (step S104). Also, the density pattern generating unit 15 generates an Nth density pattern corresponding to the Nth average value of the optical intensity distribution (step S105).

In the density pattern generating apparatus 1, density patterns are generated with respect to all the layout division regions 61A by repeating processing of steps S103 to S105. When the exposure simulation is completed with respect to all the layout division regions 61A (Yes in step S106), the exposure simulation unit 13 notifies the completion of the exposure simulation to the optical image average value calculating unit 14. In this way, the optical image average value calculating unit 14 notifies the density pattern generating unit 15 that the processing of calculating the average value of the optical intensity distribution is completed.

Then, the density pattern generating unit 15 generates a density pattern group according to the layout pattern by connecting the respective layout division regions 61A where the density patterns are formed. The outputting unit 16 outputs the density pattern group generated by the density pattern generating unit 15 to the flare map calculating apparatus 2 (step S107).

Figure 5A:
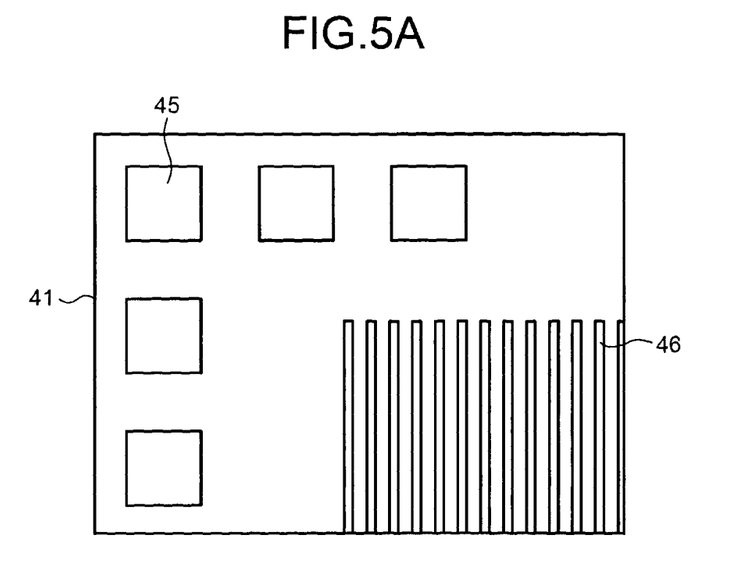
FIG. 5A is a diagram illustrating an example of a layout pattern.
Figure 5B:
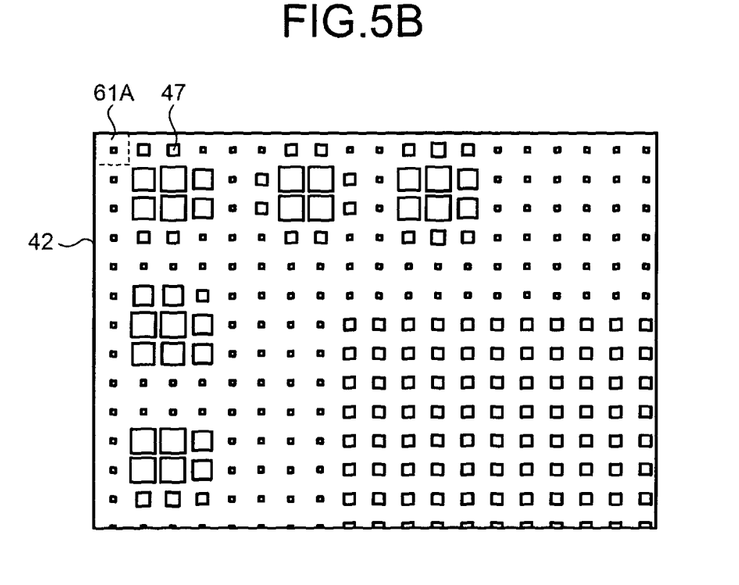
FIG. 5B is a diagram illustrating an example of a density pattern group.

FIGS. 5A and 5B are diagrams illustrating an example of the layout pattern and the density pattern group. FIG. 5A illustrates the layout pattern 41, and FIG. 5B illustrates the density pattern group 42. The density pattern group 42 is output by performing the exposure simulation with respect to the layout pattern 41 to calculate the average value of the optical intensity distribution, and converting the average value of the optical intensity distribution into the density patterns.

A plurality of rectangular patterns 45 or line-shaped patterns 46 are included in the layout pattern 41. The density pattern group 42 is generated by using the layout pattern 41.

The density pattern generating apparatus 1, for example, divides the layout pattern 41 into 266 layout division regions 61A by dividing the layout pattern 41 by 14 in a longitudinal direction and dividing the layout pattern 41 by 19 in a transverse direction. Also, only one layout division region 61A is illustrated in FIG. 5.

The density pattern generating apparatus 1 calculates the optical image intensity distribution in each layout division region 61A by applying the exposure simulation to the layout pattern 41. Furthermore, the density pattern generating apparatus 1 calculates the average values of the optical intensity distributions in the respective layout division regions 61A, and generates the density pattern 47 corresponding to the respective average values of the optical intensity distributions. For example, one density pattern 47 is generated within each layout division region 61A.

After generating the density pattern 47, the density pattern generating apparatus 1 generates the density pattern group 42 according to the layout pattern 41 by connecting the respective layout division regions 61A generating the density pattern 47.

In the density pattern, a pattern with an adjusted pattern density is generated such that the average value of the optical intensity distribution has the same value as the pattern density within the layout division region 61A. For example, in the case where the partition width of the layout division region 61A is 1 μm, when the average value of the optical intensity distribution is 1 (100%), a rectangular pattern of 1 μm×1 μm is output as the density pattern. Also, when the average value of the optical intensity distribution is 0.5 (50%), a rectangular pattern of √0.5 μm×√0.5 μm=about 0.71 μm×0.71 μm is output as the density pattern. Also, although the case where the density pattern is rectangular has been described herein, the density pattern may have a shape other than the rectangular shape.

Figure 6:
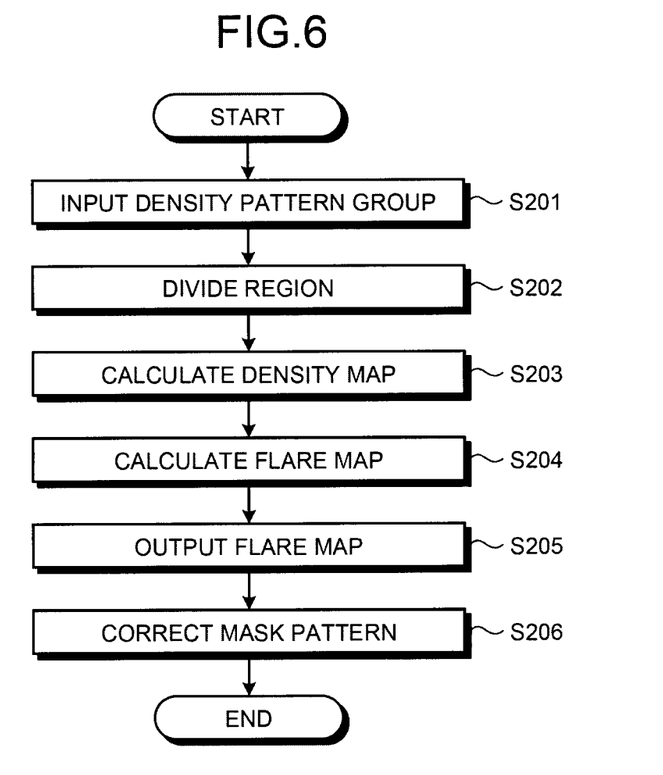
FIG. 6 is a flowchart illustrating a processing procedure of correcting a mask pattern.

Next, the processing procedure of correcting the mask pattern will be described. FIG. 6 is a flowchart illustrating the processing procedure of correcting the mask pattern. In the embodiment, the flare map is calculated by using the density pattern group, and the flare correction is performed with respect to the mask pattern by using the calculated flare map.

The density pattern inputting unit 21 of the flare map calculating apparatus 2 receives the density pattern group from an external device or the like (step S201), and transfers the density pattern group to the region dividing unit 22. The region dividing unit 22 divides the density pattern group into a plurality of density pattern group division regions 61B by partitioning the density pattern group by a second width (step S202). The region dividing unit 22 transfers information indicating respective ranges of the density pattern group division regions 61B, and density patterns within the respective density pattern group division regions 61B to the density map calculating unit 23.

The density map calculating unit 23 calculates pattern densities in the respective density pattern group division regions 61B divided by the region dividing unit 22 (by performing pattern density approximation), and calculates the density map by using the pattern densities (step S203). The density map calculating unit 23 transfers the calculated density map to the flare map calculating unit 24.

The flare map calculating unit 24 calculates the flare map by using the density map calculated by the density map calculating unit 23 (step S204). Specifically, the flare map calculating unit 24 calculates the flare map by the convolution integral (convolution calculation) of the density map and the PSF, based on Equation (1). Also, Density Map(x, y) in Equation (1) is the density map, and Flare(x, y) is the flare map.

[Equation 1]

$$\text{Flare}(x,y) = \text{DensityMap}(x,y) \otimes \text{PSF} \qquad (1)$$

As described above, in the embodiment, the flare calculation is performed by using the density pattern as the input value, instead of the layout pattern. The flare map calculating unit 24 transfers the calculated flare map to the outputting unit 25. The outputting unit 25 outputs the flare map to the mask pattern correcting apparatus 3 (step S205).

Figure 7A:
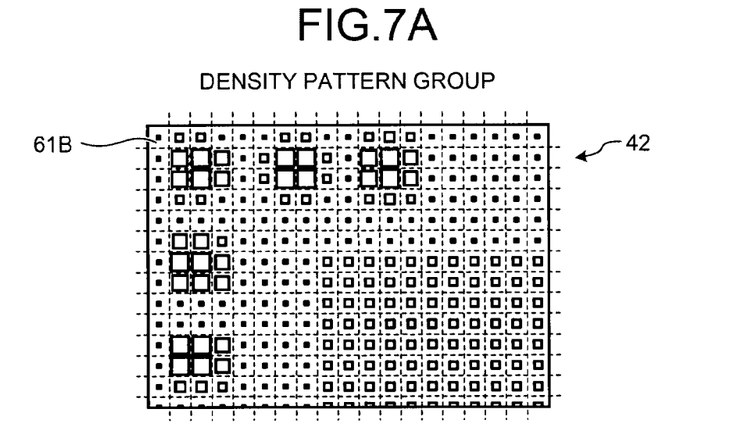
FIGS. 7A to 7C are diagrams describing processing of creating a flare map.
Figure 7B:
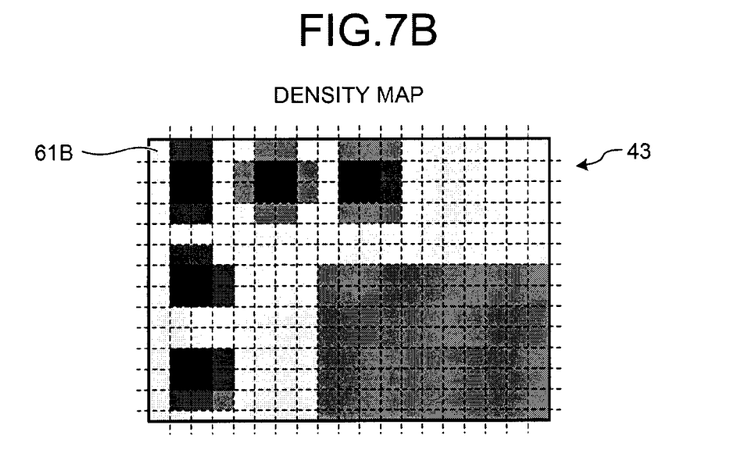
Figure 7C:
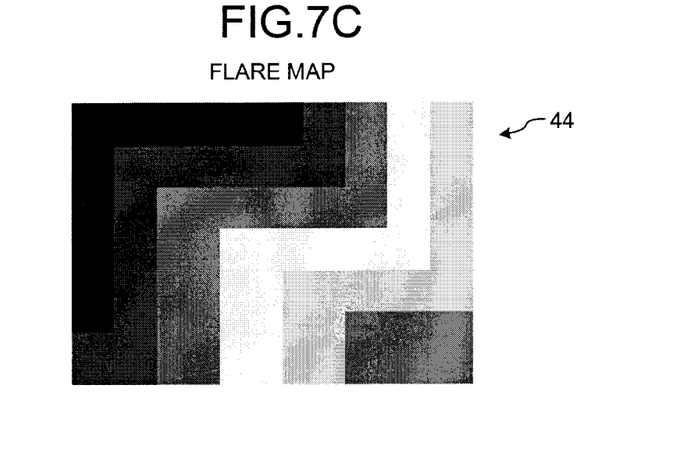

FIGS. 7A to 7C are diagrams describing the processing of creating the flare map. FIG. 7A is a diagram illustrating an example of the density pattern group, FIG. 7B is a diagram illustrating an example of the density map, and FIG. 7C is a diagram illustrating an example of the flare map.

As illustrated in FIG. 7A, the density pattern group 42 is divided into a plurality of density pattern group division regions 61B. As illustrated in FIG. 7B, the density map 43 is calculated by using the density pattern group 42. Furthermore, as illustrated in FIG. 7C, the flare map 44 is calculated by using the density map 43.

The flare map inputting unit 31 of the mask pattern correcting apparatus 3 receives the flare map transferred from the flare map calculating apparatus 2, and transfers the flare map to the mask pattern correcting unit 32. Also, the mask pattern inputting unit 33 receives mask pattern data subjected to flare correction from an external device or the like. The mask pattern inputting unit 33 transfers mask pattern data to the mask pattern correcting unit 32. Also, the input of the mask pattern data may be earlier or later than the input of the flare map.

The mask pattern correcting unit 32 performs the mask pattern correction (flare correction) with respect to the mask pattern data, which is transferred from the mask pattern inputting unit 33, by using the flare map (step S206). The mask pattern correcting unit 32 transfers the flare-corrected mask pattern data to the outputting unit 34. The outputting unit 34 outputs the flare-corrected mask pattern data to an external device or the like.

As described above, since the mask pattern correcting system calculates the flare map by using the exposure simulation, the prediction accuracy of the flare value may be improved. Also, in the mask pattern correcting system, the average value of the optical intensity distribution of each layout division region 61A is set as a representative value of the optical image intensity of each layout division region 61A. Therefore, compared with the case where the flare calculation is performed by using the optical image intensity itself, an amount of data handled may be considerably reduced. As a result, the flare calculation may be performed in a short time. Also, since the prediction accuracy of the flare value is improved, the yield of the device fabrication may be improved.

Also, the mask pattern correcting system performs the flare calculation by converting the average value of the optical intensity distribution into the density pattern and convolution-calculating the density pattern and the flare PSF. Therefore, the general flare calculating method using the layout data as the input value may be used as it is. Therefore, since the existing flare calculation tool may be used, development man hour may be remarkably reduced.

By the way, a memory device such as NAND (NAND flash memory) is an assembly of the same data storage modules, and the layout data is hierarchically configured (may be expressed) with a small-scale pattern group called a seed cell. Therefore, if the hierarchical structure of the layout data is used, the exposure simulation has only to be performed with respect to the pattern that is a base of the repetitive arrangement. Therefore, data to be processed may be remarkably reduced. By using the above-described technology, the flare calculation on the entire surface of the chip may be processed in a short time.

Also, in the embodiment, the case where the flare map is calculated by the convolution calculation of the density map and the PSF has been described. However, the flare map may also be calculated by the convolution calculation of a partition representative value map of a two-dimensional array (average value of optical intensity distribution in each layout division region 61A) and the PSF.

The partition representative value map is information corresponding to the density map (density pattern group) and is information indicating the distribution of the average value of the optical intensity distribution in the layout data region. In the partition representative value map, the average value of the optical intensity distribution (representative value) within each layout division region 61A is represented by numerical data (for example, binary data), text data, image data, and the like. For example, the average value of the optical intensity distribution within each layout division region 61A is represented by numerical data, and the numerical data may be placed in correspondence with the arrangement position of each two-dimensionally arrayed layout division region 61A. In this way, the average value of the optical intensity distribution of the two-dimensional array becomes the partition representative value map. In other words, in the density pattern group, the density pattern is allocated to each layout division region 61A, but in the partition representative value map, the numerical data or the like corresponding to the density pattern is allocated to each layout division region 61A. For example, by configuring the partition representative value map with the binary data of the two-dimensional array, a data amount to be stored in a memory or a file may be reduced. Therefore, a finite memory or disk may be efficiently used. Also, by using the partition representative value map, it is unnecessary to convert the numerical data or the like into the density pattern. Therefore, an amount of information processing may be reduced.

Also, the partition representative value map may be pattern data defined using a Graphic Data System (GDS) file, an Open Artwork System Interchange Standard (OASIS) file, or the like. In this case, the partition representative value map stores information capable of deriving the flare value from a single layer or a combination of a plurality of layers in each partition.

In the layer defined by the GDS or the OASIS, patterns of different attributes may be defined in each layer. The attribute of the layer is defined according to the object, for example, a layer to be corrected, a layer to be not corrected, or the like. Therefore, a desired pattern may be configured by combining patterns of various attributes. By pattern-outputting (data-retaining) the average value of the optical intensity distribution as the layer depending on the average value of the optical intensity distribution, the data amount may be reduced.

In the case where the flare map is calculated by the convolution calculation of the partition representative value map and the PSF, the partition representative value map is calculated based on the average value of the optical intensity distribution, without deriving the density pattern. In this case, the partition representative value map is derived from the average value of the optical intensity distribution in each layout division region 61A, and the flare map is calculated by using the partition representative value map.

Figure 8:
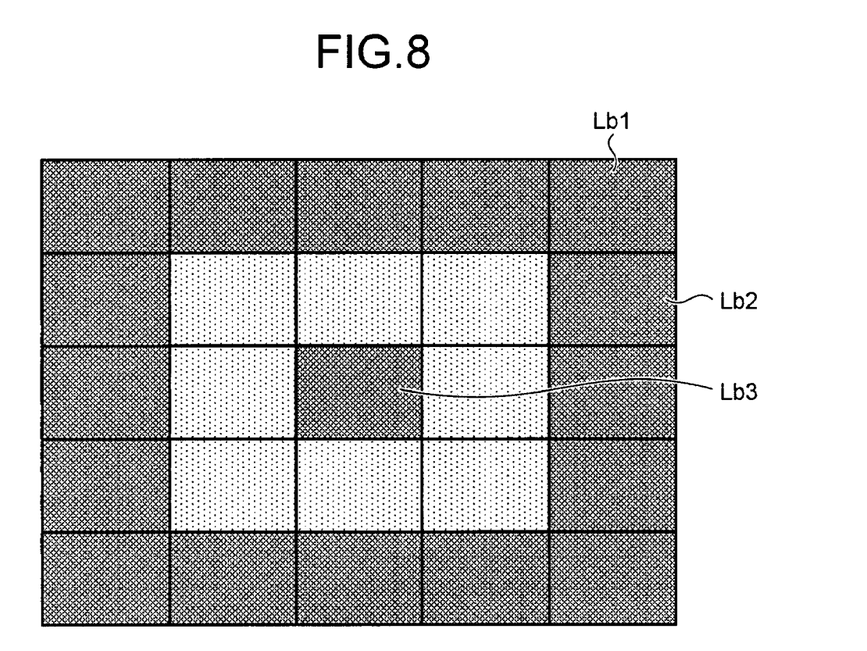
FIG. 8 is a diagram describing processing of deriving an average value of optical intensity distribution from a layer.

FIG. 8 is a diagram illustrating an example describing the processing of deriving the average value of the optical intensity distribution from the layer. In FIG. 8, the diagram describing the processing of deriving the average value of the optical intensity distribution from the layer is illustrated.

In the case where the average value of the optical intensity distribution is derived from the layer, a relation between the layer and the average value of the optical intensity distribution is defined in advance. For example, the case where the average value of the optical intensity distribution is 0.1 to 0.2, the case where the average value of the optical intensity distribution is 0.2 to 0.3, and the case where the average value of the optical intensity distribution is 0.3 to 0.4 are defined as a layer Lb1, a layer Lb2, and a layer Lb3, respectively. The average value of the optical intensity distribution within each layout division region 61A may be retained as any one of the layers Lb1 to Lb3. When deriving the partition representative value map, the layers Lb1 to Lb3 are converted into the average value of the optical intensity distribution. As described above, although the average value of the optical intensity distribution is partitioned and the layers are defined according to the partition, any method may be used as long as the optical intensity value in each partition can be derived from layer information.

Also, in the embodiment, although the case where the exposure simulation is performed with respect to all the layout patterns has been described, the exposure simulation with respect to patterns having a large size (layout patterns having a larger size than a predetermined value) may be omitted, and a predefined value (average value of the optical intensity distribution) (corresponding to a density value of the layout division region 61A) may be used. In the case where patterns having a smaller size than the predetermined value are included in the exposure simulation region (layout division region 61A), the speed of the exposure simulation may be increased by performing an optical simulation. Also, the layout data may be divided in a shape other than the mesh shape.

The correction of the mask pattern by the mask pattern correcting system, for example, is performed in each layer of a wafer process. A semiconductor device (semiconductor integrated circuit) is manufactured by using a mask whose mask pattern is corrected. Specifically, the mask is manufactured by using a mask pattern after the correction. The exposure (for example, EUV exposure) is performed with respect to a resist-coated wafer by using the mask. Then, a resist pattern is formed on the wafer by developing the wafer. Furthermore, a lower layer of the wafer is etched by using the resist pattern as a mask. In this way, an actual pattern corresponding to the resist pattern is formed on the wafer. In manufacturing the semiconductor device, the above-described mask pattern correction (flare correction) processing, the exposure processing, the development processing, the etching processing, or the like are repeated in each layer.

Figure 9:
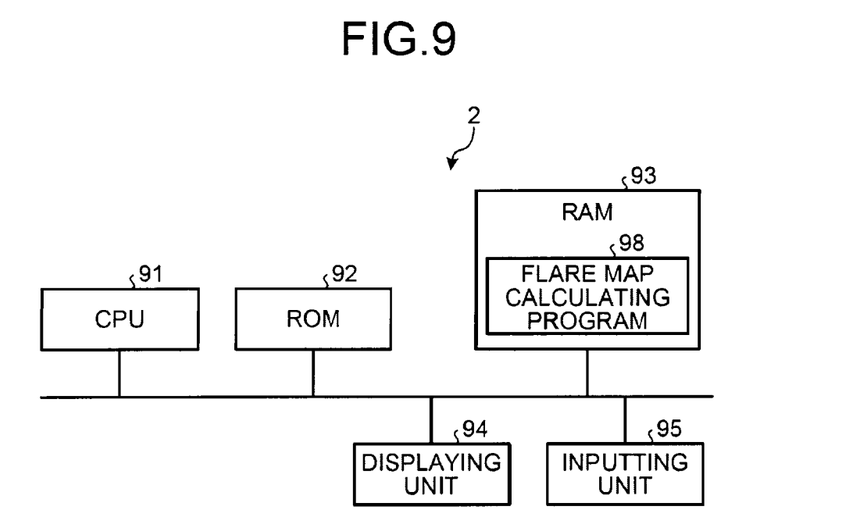
FIG. 9 is a diagram illustrating a hardware configuration of a flare map calculating apparatus.

Next, the hardware configuration of the flare map calculating apparatus 2 will be described. FIG. 9 is a diagram illustrating the hardware configuration of the flare map calculating apparatus. The flare map calculating apparatus 2 includes a central processing unit (CPU) 91, a read only memory (ROM) 92, a random access memory (RAM) 93, a displaying unit 94, and an inputting unit 95. In the flare map calculating apparatus 2, the CPU 91, the ROM 92, the RAM 93, the displaying unit 94, and the inputting unit 95 are connected through a bus line.

The CPU 91 calculates the flare map by using a flare map calculating program 98 that is a computer program. The flare map calculating program 98 is store by a non-transitory computer readable recording medium.

The displaying unit 94 is a display device such as a liquid crystal monitor or the like, and displays the density pattern, the density pattern group division region 61B, the density map, the flare map, and the like, based on an instruction from the CPU 91. The inputting unit 95 is configured to include a mouse or a keyboard, and inputs instruction information externally input from a user (parameters or the like necessary for calculating the flare map). The instruction information input to the inputting unit 95 is transferred to the CPU 91.

The flare map calculating program 98 is stored in the ROM 92 and is loaded into the RAM 93 through the bus line. FIG. 9 illustrates a state in which the flare map calculating program 98 is loaded into the RAM 93.

The CPU 91 executes the flare map calculating program 98 loaded into the RAM 93. Specifically, in the flare map calculating apparatus 2, according to an instruction input from the inputting unit 95 by the user, the CPU 91 reads the flare map calculating program 98 from the ROM 92, deploys the flare map calculating program 98 in a program storage area inside the RAM 93, and performs a variety of processing. The CPU 91 temporarily stores a variety of data, which are generated during the variety of processing, in a data storage area formed inside the RAM 93.

The flare map calculating program 98 executed in the flare map calculating apparatus 2 has a module configuration including the region dividing unit 22, the density map calculating unit 23, and the flare map calculating unit 24, which are loaded on a main storage unit and are generated on the main storage unit.

Also, the density pattern generating apparatus 1 and the mask pattern correcting apparatus 3 have the same hardware configuration as the flare map calculating apparatus 2. The density pattern generating apparatus 1 calculates an optical image intensity distribution by using layout data by using an optical image intensity distribution calculating program, and generates a density pattern by using a density pattern generating program. Also, the mask pattern correcting apparatus 3 corrects a mask pattern by using a mask pattern correcting program.

Figure 10:
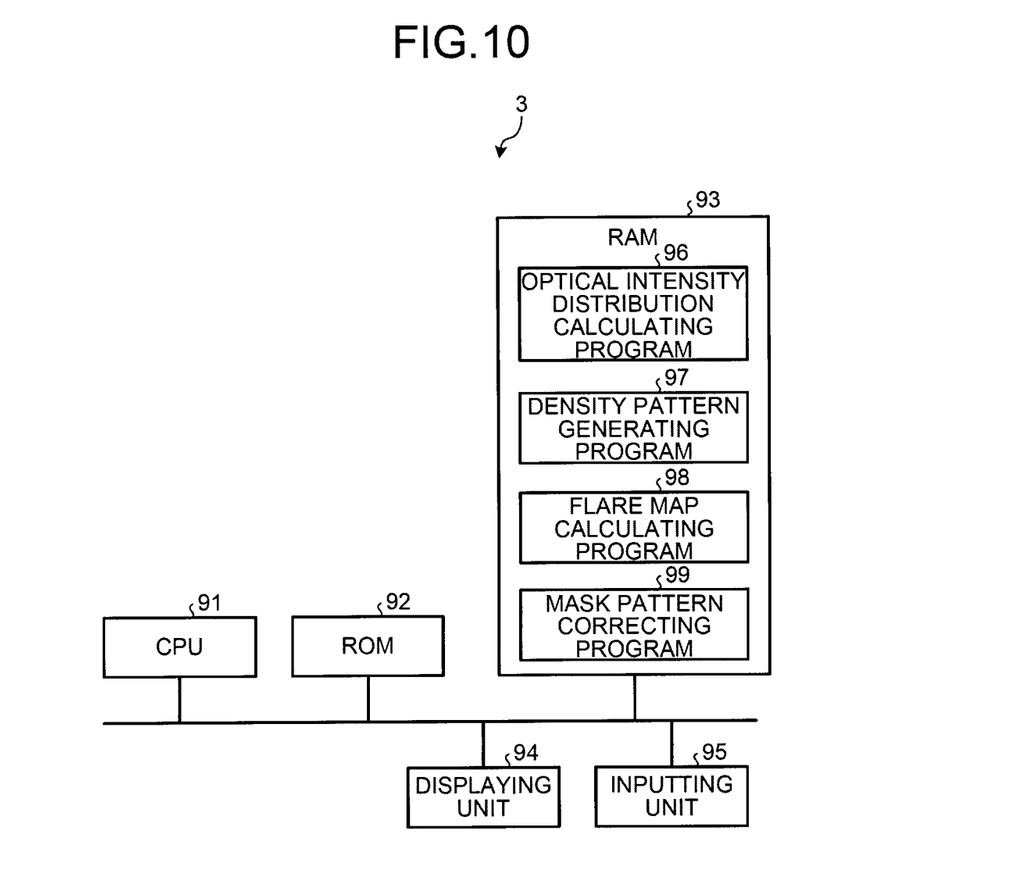
FIG. 10 is a diagram illustrating a hardware configuration of a mask pattern correcting system.

Herein, the hardware configuration of the mask pattern correcting system, which includes the density pattern generating apparatus 1, the flare map calculating apparatus 2, and the mask pattern correcting apparatus 3, will be described. FIG. 10 is a diagram illustrating the hardware configuration of the mask pattern correcting system. The mask pattern correcting apparatus 3 has the same hardware configuration as the flare map calculating apparatus 2.

The optical image intensity distribution calculating program 96, the density pattern generating program 97, the flare map calculating program 98, and the mask pattern correcting program 99 are stored in the ROM 92 and are loaded into the RAM 93 through a bus line. FIG. 10 illustrates a state in which each program in the ROM 92 is loaded on the RAM 93. Also, the programs may be loaded into the ROM 92 one by one, or the plurality of programs may be loaded at a time.

The CPU 91 executes the optical image intensity distribution calculating program 96, the density pattern generating program 97, the flare map calculating program 98, and the mask pattern correcting program 99, which are loaded into the RAM 93.

The optical image intensity distribution calculating program 96 has a module configuration including the region dividing unit 12 and the exposure simulation unit 13, which are loaded on a main storage unit and are generated on the main storage unit.

Also, the density pattern generating program 97 has a module configuration including the optical image average value calculating unit 14 and the density pattern generating unit 15, which are loaded on a main storage unit and are generated on the main storage unit.

Also, the flare map calculating program 98 has a module configuration including the region dividing unit 22, the density map calculating unit 23, and the flare map calculating unit 24, which are loaded on a main storage unit and are generated on the main storage unit.

Also, the mask pattern correcting program 99 has a module configuration including the mask pattern correcting unit 32, which is loaded on a main storage unit and are generated on the main storage unit.

Also, any of the optical image intensity distribution calculating program 96, the density pattern generating program 97, the flare map calculating program 98, and the mask pattern correcting program 99 may be combined into a single program.

For example, the optical image intensity distribution calculating program 96 and the density pattern generating program 97 may be combined into a single program. Also, the density pattern generating program 97 and the flare map calculating program 98 may be combined into a single program. Also, the flare map calculating program 98 and the mask pattern correcting program 99 may be combined into a single program. Also, the optical image intensity distribution calculating program 96, the density pattern generating program 97, the flare map calculating program 98, and the mask pattern correcting program 99 may be combined into a single program. Furthermore, instead of the ROM 92, an external storage device (HDD or the like) may be used. Also, a connection other than the bus line, such as a LAN connection or the like, may be used.

Also, in the embodiment, the case where the calculated flare map is used to correct the mask pattern has been described, but the calculated flare map may also be used to verify the on-substrate pattern. In this case, by performing the exposure simulation in consideration of the flare, the pattern shape of the on-substrate pattern formed on the substrate is predicted. Then, it is verified whether the predicted pattern shape is a pattern shape according to the layout data (design pattern).

According to the embodiment, the flare map is calculated by calculating the average value of the optical intensity distribution by using the exposure simulation, calculating the density pattern based on the average value of the optical intensity distribution, and convolution-calculating the density pattern and the PSF. Therefore, the flare map may be calculated with the remarkable reduction in the data amount and the calculation amount. Therefore, the flare map calculation and the mask pattern correction may be performed at high speed and with high accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flare map calculating method comprising:
   dividing, by using a computer, a pattern region having a plurality of patterns to set a plurality of division regions in the pattern region;
   performing, by using a computer, a first exposure simulation in each of the division regions to calculate an optical image intensity distribution in each of the division regions;
   calculating, by using a computer, an average value of the optical image intensity distribution of the division regions as an average value of optical intensity distribution in each of the division regions;
   generating, by using a computer, a pattern or plural patterns, which has a pattern density corresponding to the average value of the optical intensity distribution, as a corresponding density pattern in each of the division regions;
   generating, by using a computer, a density map representing a pattern density distribution within the pattern region based on the corresponding density pattern; and
   calculating, by using a computer, a flare map representing a flare intensity distribution within the pattern region by convolution integral of the density map and a point spread function.

2. The flare map calculating method according to claim 1, wherein when generating the density map, the density map is generated in a region where the pattern region is equal to or larger than the division region.

3. The flare map calculating method according to claim 1, further comprising flare-correcting a mask pattern corresponding to the plurality of patterns by using the flare map.

4. The flare map calculating method according to claim 1, further comprising predicting an on-substrate pattern, which is formed on a substrate, by performing a second exposure simulation with respect to the plurality of patterns by using the flare map.

5. The flare map calculating method according to claim 1, wherein the plurality of patterns are design layout patterns or mask patterns.

6. The flare map calculating method according to claim 1, wherein when setting the division regions, the pattern region is divided in a mesh shape.

7. The flare map calculating method according to claim 1, wherein the first exposure simulation is performed with respect to the division regions, where patterns having a smaller size than a predetermined value are included, among the plurality of division regions, and a predefined average value of optical intensity distribution corresponding to a density value of the region is applied to the division regions, where patterns having a larger size than a predetermined value are included, among the plurality of division regions.

8. A flare map calculating method comprising:
   dividing, by using a computer, a pattern region having a plurality of patterns to set a plurality of division regions in the pattern region;
   performing, by using a computer, a first exposure simulation in each of the division regions to calculate an optical image intensity distribution in each of the division regions;
   calculating, by using a computer, an average value of the optical image intensity distribution of the division regions as an average value of optical intensity distribution in each of the division regions;
   retaining, by using a computer, correspondence information in which information indicating the average value of the optical intensity distribution is matched with each of the division regions which are two-dimensionally arrayed, as distribution information of an average value of optical intensity distribution within the pattern region; and
   calculating, by using a computer, a flare map representing a flare intensity distribution within the pattern region by convolution integral of the distribution information and a point spread function.

9. The flare map calculating method according to claim 8, wherein the distribution information of the average value of the optical intensity distribution is binary data.

10. The flare map calculating method according to claim 8, wherein the distribution information of the average value of the optical intensity distribution is pattern data defined by a GDS file or an OASIS file, and the information indicating the average value of the optical intensity distribution is retained such that the average value of the optical intensity distribution is derived from a single layer or a combination of a plurality of layers in each of the division regions.

11. The flare map calculating method according to claim 8, further comprising flare-correcting a mask pattern corresponding to the plurality of patterns by using the flare map.

12. The flare map calculating method according to claim 8, further comprising predicting an on-substrate pattern, which is formed on a substrate, by performing a second exposure simulation with respect to the plurality of patterns by using the flare map.

13. The flare map calculating method according to claim 8, wherein the plurality of patterns are design layout patterns or mask patterns.

14. The flare map calculating method according to claim 8, wherein when setting the division regions, the pattern region is divided in a mesh shape.

15. The flare map calculating method according to claim 8, wherein the first exposure simulation is performed with respect to the division regions, where patterns having a smaller size than a predetermined value are included, among the plurality of division regions, and a predefined average value of optical intensity distribution corresponding to a density value of the region is applied to the division regions, where patterns having a larger size than a predetermined value are included, among the plurality of division regions.

16. A non-transitory computer readable recording medium storing a flare map calculating program calculating a flare map on a computer, the flare map calculating program causing the computer to execute:

dividing a pattern region having a plurality of patterns to set a plurality of division regions in the pattern region;

performing an exposure simulation in each of the division regions to calculate an optical image intensity distribution in each of the division regions;

calculating an average value of the optical image intensity distribution of the division regions as an average value of optical intensity distribution in each of the division regions;

generating a pattern or plural patterns, which has a pattern density corresponding to the average value of the optical intensity distribution, as a corresponding density pattern in each of the division regions;

generating a density map representing a pattern density within the pattern region based on the corresponding density pattern; and calculating the flare map of the pattern region by convolution integral of the density map and a point spread function.

17. The non-transitory computer readable recording medium according to claim 16, wherein when generating the density map, the density map is generated in a region where the pattern region is equal to or larger than the division region.

18. The non-transitory computer readable recording medium according to claim 16, wherein a mask pattern corresponding to the plurality of patterns is flare-corrected by using the flare map.

19. The non-transitory computer readable recording medium according to claim 16, wherein an on-substrate pattern, which is formed on a substrate, is predicted by performing a second exposure simulation with respect to the plurality of patterns by using the flare map.

20. The non-transitory computer readable recording medium according to claim 16, wherein the plurality of patterns are design layout patterns or mask patterns.

\* \* \* \* \*